(12) United States Patent
Zhu et al.

(10) Patent No.: US 12,507,561 B2
(45) Date of Patent: Dec. 23, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Xiaoguang Zhu, Hubei (CN); Tao Chen, Hubei (CN); Zhiqiao Liu, Hubei (CN); Guo Cheng, Hubei (CN); Zhuo Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 651 days.

(21) Appl. No.: 17/905,255

(22) PCT Filed: Aug. 9, 2022

(86) PCT No.: PCT/CN2022/111114
§ 371 (c)(1),
(2) Date: Aug. 29, 2022

(87) PCT Pub. No.: WO2024/021160
PCT Pub. Date: Feb. 1, 2024

(65) Prior Publication Data
US 2024/0224684 A1  Jul. 4, 2024

(30) Foreign Application Priority Data

Jul. 25, 2022 (CN) .......................... 202210874372.1

(51) Int. Cl.
*H10K 59/35* (2023.01)

(52) U.S. Cl.
CPC .................................. *H10K 59/353* (2023.02)

(58) Field of Classification Search
CPC ........................... H10K 59/353; H10K 59/352
See application file for complete search history.

(56) References Cited

U.S. PATENT DOCUMENTS

2022/0069031 A1* 3/2022 Yue ...................... H10K 59/122
2022/0238610 A1* 7/2022 Xu ....................... H10K 59/353
(Continued)

FOREIGN PATENT DOCUMENTS

| CN | 110137206 A | 8/2019 |
| CN | 113097277 A | 7/2021 |

(Continued)

OTHER PUBLICATIONS

Chinese Office Action in corresponding Chinese Patent Application No. 202210874372.1 dated Sep. 1, 2022, pp. 1-8.
(Continued)

*Primary Examiner* — Steven B Gauthier
*Assistant Examiner* — Alvin L Lee
(74) *Attorney, Agent, or Firm* — PV IP PC; Wei Te Chung

(57) ABSTRACT

A display panel and a display device are provided. One first sub-pixel at a corner, two second sub-pixels at a side of the virtual rectangle and adjacent to the first sub-pixel, and one first sub-pixel within the virtual rectangle form a virtual right-angled trapezoid. A third sub-pixel is arranged within the virtual right-angled trapezoid, distances from a center of the third sub-pixel to centers of two first sub-pixels corresponding to the virtual right-angled trapezoid are equal, and the center of the third sub-pixel does not overlap with a line connecting the centers of the two first sub-pixels.

17 Claims, 6 Drawing Sheets

(56) References Cited

U.S. PATENT DOCUMENTS

2024/0138222 A1\* 4/2024 Liu .................... H10K 59/8723
2025/0017069 A1\* 1/2025 Chen .................... G06F 3/0443

FOREIGN PATENT DOCUMENTS

| CN | 113327972 A | 8/2021 |
|----|-------------|--------|
| CN | 113327973 A | 8/2021 |
| CN | 113488521 A | 10/2021 |
| KR | 20170116598 A | 10/2017 |
| WO | 2022110169 A1 | 6/2022 |
| WO | 2022110173 A1 | 6/2022 |

OTHER PUBLICATIONS

International Search Report in International application No. PCT/CN2022/111114, mailed on Mar. 23, 2023.
Written Opinion of the International Search Authority in International application No. PCT/CN2022/111114, mailed on Mar. 23, 2023.

\* cited by examiner

DISPLAY PANEL AND DISPLAY DEVICE

FIELD OF INVENTION

The present application relates to a field of display technology, and particularly relates to a display panel and a display device having the display panel.

BACKGROUND OF INVENTION

An organic light-emitting diode (OLED) display panel performs autonomous light-emitting displays through an organic layer. Because it does not need a backlight, it has faster response times, larger viewing angles, higher contrast, lighter device weight, and low power consumption. It is currently recognized as the most promising flat panel display technology.

Currently, in a high-resolution OLED display panel, the organic layer includes an electron layer, an organic light-emitting layer, and a hole layer, wherein the electron layer and the hole layer are both formed as whole surfaces. Furthermore, between at least some adjacent pixels, due to a small distance, electrons are likely to migrate through the electron layer, resulting in a phenomenon of accidental light emission between adjacent pixels. Additionally, in the high-resolution OLED display panel, because an interval between adjacent pixels is small, the space for manufacturing support columns of a jig for supporting a mask (for vapor deposition of organic light-emitting materials) is limited, which affects the support effect of the support columns.

Technical Problem

Embodiments of the present application provide a display panel and a display device, which can reduce the probability of accidental light emission between adjacent sub-pixels and improve the display effect of the display panel. In addition, the manufacturing space of the support columns can be increased, and the supporting effect of the support columns can be enhanced.

SUMMARY OF INVENTION

An embodiment of the present application provides a display panel, the display panel includes a plurality of first sub-pixels, a plurality of second sub-pixels, and a plurality of third sub-pixels. The first sub-pixels are arranged at four corners of a virtual rectangle and within the virtual rectangle, and the second sub-pixels are arranged at four sides of the virtual rectangle. In the same virtual rectangle, the first sub-pixel at the corner, two second sub-pixels adjacent to the first sub-pixel, and the first sub-pixel within the virtual rectangle form a virtual right-angled trapezoid. Wherein one of the third sub-pixels is arranged within the virtual right-angled trapezoid, distances from a center of the third sub-pixel to centers of two first sub-pixels corresponding to the virtual right-angled trapezoid are equal, and the center of the third sub-pixel does not overlap with a line connecting the centers of the two first sub-pixels.

In an embodiment of the present application, distances from the center of the third sub-pixel to centers of the two second sub-pixels corresponding to the virtual right-angled trapezoid are equal, and the center of the third sub-pixel does not overlap with a line connecting the centers of the two second sub-pixels.

In an embodiment of the present application, on at least one side of the virtual rectangle, a first distance from a center of one of the second sub-pixels to a center of an adjacent one of the first sub-pixels is less than a second distance from the center of the second sub-pixel to a center of another adjacent one of the first sub-pixels.

In an embodiment of the present application, the display panel further includes a first support column arranged at a side of the virtual rectangle and located between two adjacent second sub-pixel and first sub-pixel, wherein a distance from a center of the first sub-pixel adjacent to the first support column to a center of the second sub-pixel adjacent to the first support column is defined as the second distance.

In an embodiment of the present application, the virtual rectangle includes a first side and a second side arranged oppositely and a third side and a fourth side arranged oppositely, wherein a line connecting centers of two second sub-pixels located at the first side and the second side is parallel to the third side, and the center of the first sub-pixel located within the virtual rectangle overlaps the line connecting the centers of the two second sub-pixels located at the first side and the second side.

In an embodiment of the present application, a distance from the center of the first sub-pixel located within the virtual rectangle to the center of the second sub-pixel located at the first side is greater than or equal to a distance from the center of the second sub-pixel located at the first side to a center of an adjacent first sub-pixel located at a corner of the virtual rectangle.

In an embodiment of the present application, the display panel further includes a second support column, wherein the second support column overlaps with a line connecting the center of the first sub-pixel located within the virtual rectangle and the center of the second sub-pixel located at the first side.

In an embodiment of the present application, wherein the center of the second sub-pixel located at the first side overlaps with a midpoint of the first side, and the center of the second sub-pixel located at the second side overlaps with a midpoint of the second side; and wherein a center of a second sub-pixel located at the third side does not overlap with a midpoint of the third side, and a center of a second sub-pixel located at the fourth side does not overlap with a midpoint of the fourth side.

In an embodiment of the present application, the center of the second sub-pixel located at the third side and the center of the second sub-pixel located at the fourth side are both arranged at a first side of a mid-perpendicular line of the third side.

In an embodiment of the present application, a distance from the center of the second sub-pixel located at the third side to the midpoint of the third side is equal to a distance from the center of the second sub-pixel located at the fourth side to the midpoint of the fourth side.

In an embodiment of the present application, the center of the first sub-pixel located within the virtual rectangle is arranged at a second side of the mid-perpendicular line of the third side, and the first side and the second side are located at opposite sides of the mid-perpendicular line of the third side, respectively.

In an embodiment of the present application, a distance from the center of the first sub-pixel located within the virtual rectangle to a center of the virtual rectangle is less than or equal to a distance from the center of the second sub-pixel located at the third side to the midpoint of the third side, and/or the distance from the center of the first sub-pixel located within the virtual rectangle to the center of the virtual rectangle is less than or equal to a distance from the center of the second sub-pixel located at the fourth side to the midpoint of the fourth side.

In an embodiment of the present application, a distance from the center of the first sub-pixel located within the virtual rectangle to the first side is equal to a distance from the center of the first sub-pixel located within the virtual rectangle to the second side.

In an embodiment of the present application, a distance from the center of the second sub-pixel located at the first side to the center of the first sub-pixel located within the virtual rectangle is greater than a distance from the center of the second sub-pixel located at the third side to the center of the first sub-pixel located at the first side; and a distance from the center of the second sub-pixel located at the first side to the center of the first sub-pixel located at one of the corners of the virtual rectangle is greater than a distance from the center of the second sub-pixel located at the third side to the center of the first sub-pixel located at the first side.

In an embodiment of the present application, the center of the second sub-pixel located at the third side and the center of the second sub-pixel located at the fourth side are located on opposite sides of a mid-perpendicular line of the third side, respectively.

In an embodiment of the present application, a distance from the center of the first sub-pixel located within the virtual rectangle to the first side is equal to a distance from the center of the first sub-pixel located within the virtual rectangle to the second side, and a distance from the center of the second sub-pixel located at the third side to the midpoint of the third side is equal to a distance from the center of the second sub-pixel located at the fourth side to the midpoint of the fourth side.

In an embodiment of the present application, the display panel includes a plurality of repeating units, and each repeating unit includes two virtual rectangles, wherein in one of the repeating units, a third side of one of the virtual rectangles and a fourth side of another one of the virtual rectangles are both located at a virtual straight line, and one of the virtual rectangles and another one of the virtual rectangles are axially symmetrical with respect to the virtual straight line.

In an embodiment of the present application, lines connecting the center of the first sub-pixel located within the virtual rectangle to centers of the second sub-pixels located at the four sides of the virtual rectangle divide the virtual rectangle into four virtual right-angled trapezoids.

In an embodiment of the present application, each virtual right-angled trapezoid includes a first angle, a second angle, a third angle, and a fourth angle, wherein the first angle and the second angle are both right angles, and an absolute value of a difference between the third angle and the fourth angle is greater than 0° and less than or equal to 20°.

According to the above purpose of the present application, an embodiment of the present application further provides a display device, the display device includes a device body and a display panel combined into one piece. The display panel includes a plurality of first sub-pixels, a plurality of second sub-pixels, and a plurality of third sub-pixels. The first sub-pixels are arranged at four corners of a virtual rectangle and within the virtual rectangle, and the second sub-pixels are arranged at four sides of the virtual rectangle. In the virtual rectangle, one of the first sub-pixels located at one of the corners, two second sub-pixels adjacent to the first sub-pixel, and one of the first sub-pixels within the virtual rectangle form a virtual right-angled trapezoid. Wherein one of the third sub-pixels is arranged within the virtual right-angled trapezoid, distances from a center of the third sub-pixel to centers of two first sub-pixels corresponding to the virtual right-angled trapezoid are equal, and the center of the third sub-pixel does not overlap with a line connecting the centers of the two first sub-pixels.

Advantages

Compared with the prior art, the display panel provided by the present application includes a virtual rectangle, and the virtual rectangle includes four virtual right-angled trapezoids. In each virtual right-angled trapezoid, the center of the third sub-pixel is located at a mid-perpendicular line of a line connecting the centers of the two first sub-pixels, and the center of the third sub-pixel does not overlap with the line connecting the centers of the two first sub-pixels. That is, compared with arranging the center of the third sub-pixel at the connecting line between the centers of the two first sub-pixels, in this application, the position of the third sub-pixel located within the virtual right-angled trapezoid is specially arranged so that it does not overlap with the intersection of the two diagonal lines in the virtual right-angled trapezoid, which can increase the distance between the third sub-pixel and the first sub-pixel. Further, the distances between the third sub-pixel and the two first sub-pixels are kept equal. This reduces the probability of accidental light emission between the third sub-pixel and the two first sub-pixels and improves the display effect. Furthermore, in the virtual right-angled trapezoid of the display panel, there are two parallel right-angled sides, and the longer right-angled side can be used to arrange the support column, which can increase the manufacturing space of the support column to enhance the supporting effect of the support column. In addition, the mask can be prevented from scratching the display panel.

DESCRIPTION OF DRAWINGS

The technical solutions and other beneficial effects of the present application will be easier to understand by describing the specific embodiments of the present application in detail with reference to the accompanying drawings.

DETAILED DESCRIPTION OF PREFERRED EMBODIMENTS

Figure 1:
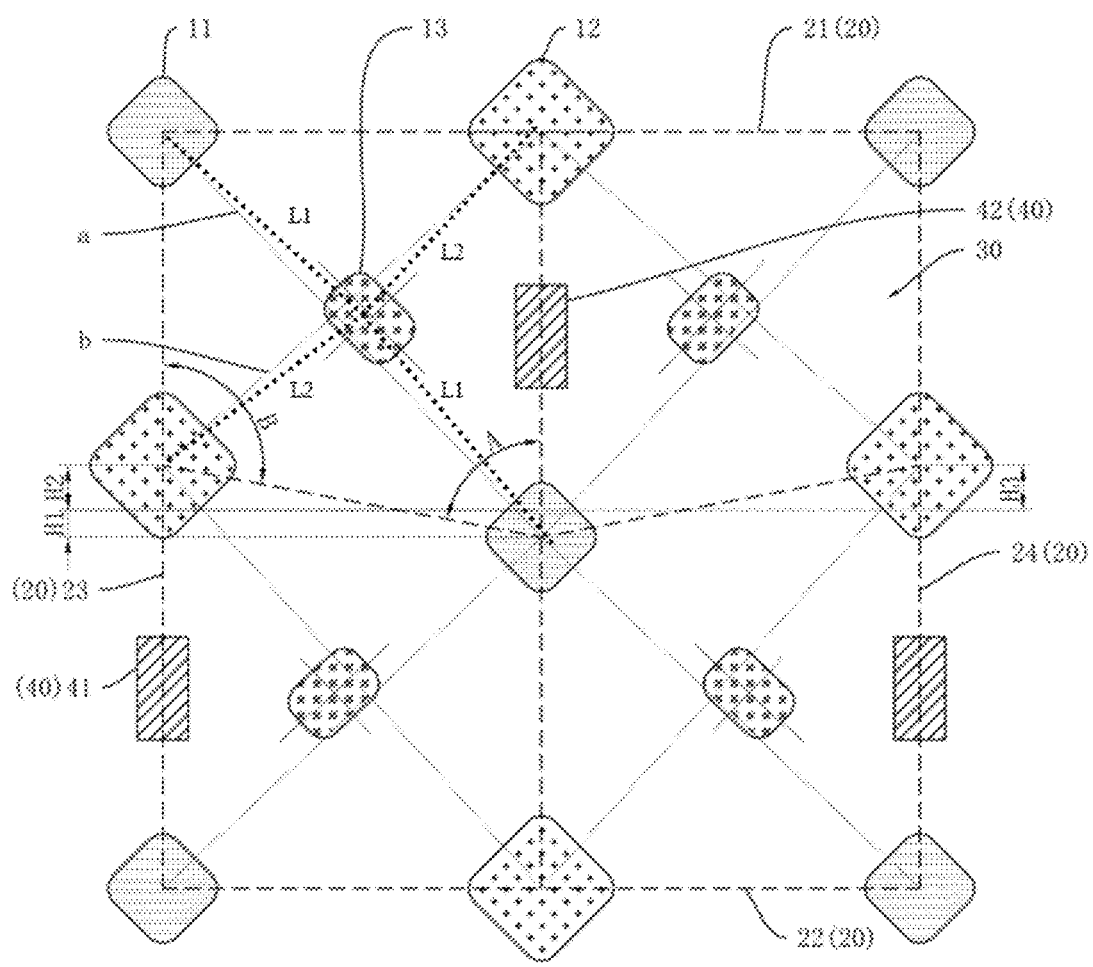
FIG. 1 is a schematic structural diagram of a pixel arrangement corresponding to a virtual rectangle of a display panel according to an embodiment of the present application.

The technical solutions in the embodiments of the present application will be clearly described with reference to the drawings in the embodiments of the present application. Obviously, the embodiments are only a part of the embodiments of the present application, but not all of the embodiments. Based on the embodiments in this application, all other embodiments obtained by one skilled in the art without doing creative efforts shall fall within the protection scope of this application.

The following disclosure provides various embodiments or examples for implementing different structures of the present application. To simplify the disclosure of the present application, the components and arrangements of specific examples are described below. Certainly, they are only examples and are not intended to limit the application. Furthermore, this application may repeat reference numerals and/or reference letters in different examples. This repetition is for the purpose of simplicity and clarity and does not in itself indicate a relationship between the various embodiments and/or arrangements discussed. In addition, this application provides examples of various specific processes and materials, but one ordinary skill in the art will recognize the application of other processes and/or the use of other materials.

An embodiment of the present application provides a display panel. Please refer to FIG. 1, the display panel includes a plurality of first sub-pixels 11, a plurality of second sub-pixels 12, and a plurality of third sub-pixels 13.

The first sub-pixels 11 are arranged at the four corners of the virtual rectangle 20 and within the virtual rectangle 20, and the second sub-pixels 12 are disposed on the four sides of the virtual rectangle 20.

In a virtual rectangle 20, a first sub-pixel 11 located at a corner of the virtual rectangle 20, two second sub-pixels 12 adjacent to the first sub-pixel 11, and a first sub-pixel 11 located within the virtual rectangle 20 form a virtual right-angled trapezoid 30.

Wherein a third sub-pixels 13 is arranged within the virtual right-angled trapezoid 30, distances L1's from the center of the third sub-pixel 13 to the centers of two first sub-pixels 11 corresponding to the virtual right-angled trapezoid 30 are equal, and the center of the third sub-pixel 13 does not overlap with a line connecting the centers of the two first sub-pixels 11 corresponding to the virtual right-angled trapezoid 30.

In the implementation and application process, the display panel provided by the present application includes a virtual rectangle 20. The virtual rectangle 20 includes four virtual right-angled trapezoids 30. In each virtual right-angled trapezoid 30, the distances from a center of the third sub-pixel 13 to the centers of two first sub-pixels 11 are equal, and lines connecting the center of the third sub-pixel 13 to the centers of the two first sub-pixels 11 are not overlapped. That is, compared with arranging the center of the third sub-pixel 13 at the connecting line between the centers of the two first sub-pixels 11, in this application, the position of the third sub-pixel 13 located within the virtual right-angled trapezoid 30 is specially arranged so that it does not overlap with the intersection of the two diagonal lines in the virtual right-angled trapezoid 30, which can increase the distance between the third sub-pixel 13 and the first sub-pixel 11. Further, the distances between the third sub-pixel 13 and the two first sub-pixels 11 are kept equal, which reduces the probability of accidental light emission between the third sub-pixel 13 and the two first sub-pixels 11 and improves the display effect.

It should be noted that the virtual rectangle 20 and the virtual right-angled trapezoid 30 described in the embodiments of the present application are all set for the convenience of description. The virtual rectangle 20 and the virtual right-angled trapezoid 30 do not exist in the actual display panel.

In an embodiment of the present application, please refer to FIG. 1. The display panel includes a plurality of sub-pixels, and the plurality of sub-pixels includes a plurality of first sub-pixels 11, a plurality of second sub-pixels 12, and a plurality of third sub-pixels 13. The plurality of first sub-pixels 11, the plurality of second sub-pixels 12, and the plurality of third sub-pixels 13 are distributed in the display area of the display panel, and each sub-pixel emits light to realize the display function of the display panel.

Optionally, the first sub-pixel 11 may be a red sub-pixel, the second sub-pixel 12 may be a blue sub-pixel, and the third sub-pixel 13 may be a green sub-pixel. Wherein, the area of the first sub-pixel 11 may be smaller than that of the second sub-pixel 12, and the area of the first sub-pixel 11 may be larger than that of the third sub-pixel 13. Further, the shape of each sub-pixel can be a circle, an ellipse, or other polygons. In the embodiment of the present application, the shape of the sub-pixel is a rounded rectangle as an example for description, but it is not limited to this, and the shape of the sub-pixel can be selected according to actual requirements.

In the embodiment of the present application, for describing the arrangement of the plurality of sub-pixels, a plurality of virtual rectangles 20 may be arranged in the display panel, and the plurality of sub-pixels are all distributed in the virtual rectangle 20.

Specifically, the first sub-pixels 11 are arranged at the four corners of the virtual rectangle 20 and within the virtual rectangle 20, and the second sub-pixels 12 are arranged at the four sides of the virtual rectangle 20. Wherein, each corner of the virtual rectangle 20 is provided with a first sub-pixel 11, a first sub-pixel 11 is arranged within the virtual rectangle 20, and each side of the virtual rectangle 20 is provided with a second sub-pixel 12.

The lines connecting the center of a first sub-pixel 11 located within the virtual rectangle 20 and the centers of the four second sub-pixels 12 located at the four sides of the virtual rectangle 20 divide the virtual rectangle 20 into four virtual right-angled trapezoids 30. In each virtual right-angled trapezoid 30, the four corners are respectively a first sub-pixel 11, two second sub-pixels 12 located at adjacent sides of the virtual rectangle 20, and a first sub-pixel 11 within the virtual rectangle 20. Further, the virtual right-angled trapezoid 30 includes four sides, and the three sides are connected in sequence to form two right angles. A third sub-pixel 13 is arranged within each virtual right-angled trapezoid 30.

On at least one side of the virtual rectangle 20, a first distance from the center of the second sub-pixel 12 to the center of an adjacent first sub-pixel 11 is less than a second distance from the center of the second sub-pixel 12 to the center of another adjacent first sub-pixel 11.

Specifically, in the embodiment of the present application, the virtual rectangle 20 includes a first side 21, a second side 22, a third side 23, and a fourth side 24, wherein, the first side 21 is arranged opposite to the second side 22, and the third side 23 is arranged opposite to the fourth side 24. The connecting line of the two second sub-pixels 12 located at the first side 21 and the second side 22 is parallel to the third side 23, and a line connecting a center of the first sub-pixel 11 located within the virtual rectangle 20 to the second sub-pixel 12 located at the first side 21 overlaps with a line connecting the center of the first sub-pixel 11 to the second sub-pixel 12 located at the second side 22.

It should be noted that the second sub-pixel 12 located at the first side 21 overlaps with the midpoint of the first side 21, and the second sub-pixel 12 located at the second side 22 overlaps the midpoint of the second side 22. That is, the center of a first sub-pixel 11 located within the virtual rectangle 20 is located at the mid-perpendicular line of the first side 21.

The second sub-pixel 12 located at the third side 23 does not overlap with the midpoint of the third side 23, and the second sub-pixel 12 located at the fourth side 24 does not overlap with the midpoint of the fourth side 24. In addition, the center of one of the first sub-pixels 11 located within the virtual rectangle 20 does not overlap with the mid-perpendicular line of the third side 23.

In the embodiment of the present application, two second sub-pixels 12 located at the third side 23 and the fourth side 24 are located at the first side of the mid-perpendicular line of the third side 23, a first sub-pixel 11 located within the virtual rectangle 20 is located at the second side of the perpendicular line of the third side 23, and the first side and the second side are opposite sides of the mid-perpendicular line of the third side. That is, in the embodiment of the present application, as shown in FIG. 1, the two second sub-pixels 12 located at the third side 23 and the fourth side 24 are located above the midpoints of the third side 23 and the fourth side 24, and the first sub-pixel 11 located within the virtual rectangle 20 is located below the center of the virtual rectangle 20. Furthermore, the line connecting the centers of the two second sub-pixels 12 located at the third side 23 and the fourth side 24 and the center of one first sub-pixel 11 located within the virtual rectangle are inclined to the third side 23 and the fourth side, respectively to form the virtual right-angled trapezoids 30.

Optionally, the distance H1 from the center of a first sub-pixel 11 within the virtual rectangle 20 to the center of the virtual rectangle 20 is less than or equal to the distance H2 from the center of the second sub-pixel 12 at the third side 23 to the midpoint of the third side 23, and less than or equal to the distance H3 from the center of the second sub-pixel 12 located at the fourth side 24 to the midpoint of the fourth side 24. In practical applications, H2/H1 can be 1-10, for example, 1, 2, 3, 4, 5, 6, 7, 8, 9, etc. Similarly, H3/H1 can be 1-10, for example, 1, 2, 3, 4, 5, 6, 7, 8, 9, etc., which are not limited herein. In addition, for the two parallel sides of the virtual right-angled trapezoid 30, the ratio of the short side to the long side ranges from 9/10 to 1 (not equal to 1). It can be 0.9, 0.91, 0.92, 0.93, 0.94, 0.95, 0.96, 0.97, 0.98, 0.99, etc., which is not limited herein.

Preferably, the distance H1 from the center of the first sub-pixel 11 located within the virtual rectangle 20 to the center of the virtual rectangle 20 is equal to the distance H2 from the center of the second sub-pixel 12 located at the third side 23 to the midpoint of the third side 23 and is equal to the distance H3 from the center of the second sub-pixel 12 located at the fourth side 24 to the midpoint of the fourth side 24. In this case, the areas of the four virtual right-angled trapezoids 30 within the same virtual rectangle 20 are equal.

In the embodiment of the present application, in the same virtual right-angled trapezoid 30, the connection line between the two first sub-pixels 11 is denoted as a first virtual diagonal line a, and the distances from the center of the third sub-pixel 13 to the centers of the two first sub-pixels 11 are equal, and the center of the third sub-pixel 13 does not overlap with the first virtual diagonal line a. That is, in the embodiment of the present application, the position of the third sub-pixel 13 is specially arranged. It does not overlap with the intersection of the two diagonal lines in the virtual right-angled trapezoid 30 so that the distance between the third sub-pixel 13 and the first sub-pixel 11 can be increased. The resolution of the current OLED display panel is improved, the distance between adjacent sub-pixels is reduced, and the electron layer and the hole layer in the organic functional layer are arranged on the whole surface. Therefore, between adjacent sub-pixels, it is easy to cause leakage through the electron layer or the like. As a result, unexpected light emission occurs between adjacent sub-pixels, which seriously affects the display effect and yield of the OLED display panel. However, in the embodiment of the present application, the distance between the first sub-pixel 11 and the third sub-pixel 13 in the same virtual right-angled trapezoid 30 can be increased. This can effectively avoid the phenomenon of accidental light emission between the first sub-pixel 11 and the third sub-pixel 13 and improve the display effect and yield of the display panel.

Further, within the same virtual right-angled trapezoid 30, the third sub-pixel 13 is also located at the mid-perpendicular line of the first virtual diagonal line a. This ensures that the distances from the third sub-pixel 13 to the centers of the two first sub-pixels 11 are equal, thereby improving display uniformity.

In addition, in each virtual right-angled trapezoid 30, the connection line between the two second sub-pixels 12 is denoted as a second virtual diagonal line b. The distances L2's from the center of the third sub-pixel 13 to the centers of the two second sub-pixels 12 are equal, and the center of the third sub-pixel 13 does not overlap with the second virtual diagonal line b. Similarly, in the embodiment of the present application, the position of the third sub-pixel 13 is specially arranged. It does not overlap with the intersection of the two diagonal lines in the virtual right-angled trapezoid 30 so that the distance between the third sub-pixel 13 and the first sub-pixel 11 can be increased. This can effectively avoid the phenomenon of accidental light emission between the first sub-pixel 11 and the third sub-pixel 13 and improve the display effect and yield of the display panel. Furthermore, within the same virtual right-angled trapezoid 30, the third sub-pixel 13 is also located at the mid-perpendicular line of the second virtual diagonal line b. This ensures that the distances from the third sub-pixel 13 to the centers of the two first sub-pixels 11 are equal, thereby improving display uniformity.

On at least one side of the virtual rectangle 20, a first distance from the center of the second sub-pixel 12 to the center of an adjacent first sub-pixel 11 is less than a second distance from the center of the second sub-pixel 12 to the center of another adjacent first sub-pixel 11. In this embodiment, the third side 23 and the fourth side 24 are both divided into two sections with different lengths. That is, the third side 23 includes the first section and the second section, and the fourth side 24 is divided into the third section and the fourth section, and the length of the first section is greater than the length of the second section, and the length of the third section is greater than the length of the fourth section. In addition, a first sub-pixel 11 located within the virtual rectangle 20 divides the connecting line of the two second sub-pixels 12 located at the first side 21 and the second side 22 into a fifth section and a sixth section, and the length of the fifth section is greater than the length of the sixth section.

For example, in FIG. 1, the first section and the third section are located at the lower side of the third side 23 and the fourth side 24, respectively. The second section and the fourth section are located at the upper side of the third side 23 and the fourth side 24, respectively. The fifth section is located at the upper side of the line connecting the two second sub-pixels 12 at the first side 21 and the second side 22, and the sixth section is located at the lower side of the line connecting the two second sub-pixels 12 at the first side 21 and the second side 22.

In this embodiment of the present application, the display panel may further include a plurality of support columns 40, and the plurality of support columns 40 include a first support column 41 and a second support column 42, wherein the first support column 41 can be arranged at the first section and the third section, and the second support column 42 can be arranged at the fifth section. In the embodiment of the present application, the two second sub-pixels 12 at the third side 23 and the fourth side 24 are arranged close to the vertex of the virtual rectangle 20 to increase the distance between some adjacent sub-pixels. Furthermore, in the embodiment of the present application, the support columns 40 are arranged between sub-pixels with a larger distance, which can increase the area of the support columns 40. In addition, when the mask is used for the evaporation process, the supporting effect of the support column 40 on the mask can be improved, which prevents the mask from scratching the display panel, thereby improving the yield of the display panel.

The distance from the center of a first sub-pixel 11 located within the virtual rectangle 20 to the second sub-pixel 12 located at the first side 21 is greater than the distance from the center of the second sub-pixel 12 at the first side 21 to the center of the adjacent first sub-pixel 11 at the corner of the virtual rectangle 20. The distance from the center of the second sub-pixel 12 at the first side 21 to the center of the adjacent first sub-pixel 11 at the corner of the virtual rectangle 20 is greater than the distance from the center of the second sub-pixel 12 at the third side 23 to the adjacent first sub-pixel 11 at the corner of the virtual rectangle 20 and is smaller than the distance from the center of the second sub-pixel 12 at the third side 23 to another adjacent first sub-pixel 11 located at the corner of the virtual rectangle 20.

Similarly, the distance from the center of a first sub-pixel 11 located within the virtual rectangle 20 to the second sub-pixel 12 located at the second side 22 is less than the distance from the center of the second sub-pixel 12 at the second side 22 to the center of the adjacent first sub-pixel 11 at the corner of the virtual rectangle 20. The distance from the center of the second sub-pixel 12 at the second side 22 to the center of the adjacent first sub-pixel 11 at the corner of the virtual rectangle 20 is less than the distance from the center of the second sub-pixel 12 at the third side 23 to the adjacent first sub-pixel 11 at the corner of the virtual rectangle 20 and is greater than the distance from the center of the second sub-pixel 12 at the third side 23 to another adjacent first sub-pixel 11 located at the corner of the virtual rectangle 20.

For example, in the virtual right-angled trapezoid 30 in the upper left of FIG. 1, the distance from the center of a first sub-pixel 11 located within the virtual rectangle 20 to the second sub-pixel 12 located at the first side 21 is greater than the distance from the center of the second sub-pixel 12 at the first side 21 to the center of the adjacent first sub-pixel 11 at the corner of the virtual rectangle 20. The distance from the center of the second sub-pixel 12 at the first side 21 to the center of the adjacent first sub-pixel 11 at the corner of the virtual rectangle 20 is greater than the distance from the center of the second sub-pixel 12 at the third side 23 to the adjacent first sub-pixel 11 located at the corner of the virtual rectangle 20 but is smaller than the distance from the center of the second sub-pixel 12 at the third side 23 to another adjacent first sub-pixel 11 located at the corner of the virtual rectangle 20.

It should be noted that each virtual right-angled trapezoid 30 includes a first corner, a second corner, a third corner A, and a fourth corner B, wherein both the first angle and the second angle are right angles, and the absolute value of the difference between the third angle A and the fourth angle B is greater than 0° and less than or equal to 20°.

Further, the display panel includes a plurality of repeating units, and each repeating unit includes at least one virtual rectangle 20. That is, the display area of the display panel includes a plurality of repeating units, and the sub-pixels in each repeating unit are arranged in the same manner. The plurality of repeating units are arranged adjacent to each other to form an arrangement of a plurality of sub-pixels in the display area.

Figure 2:
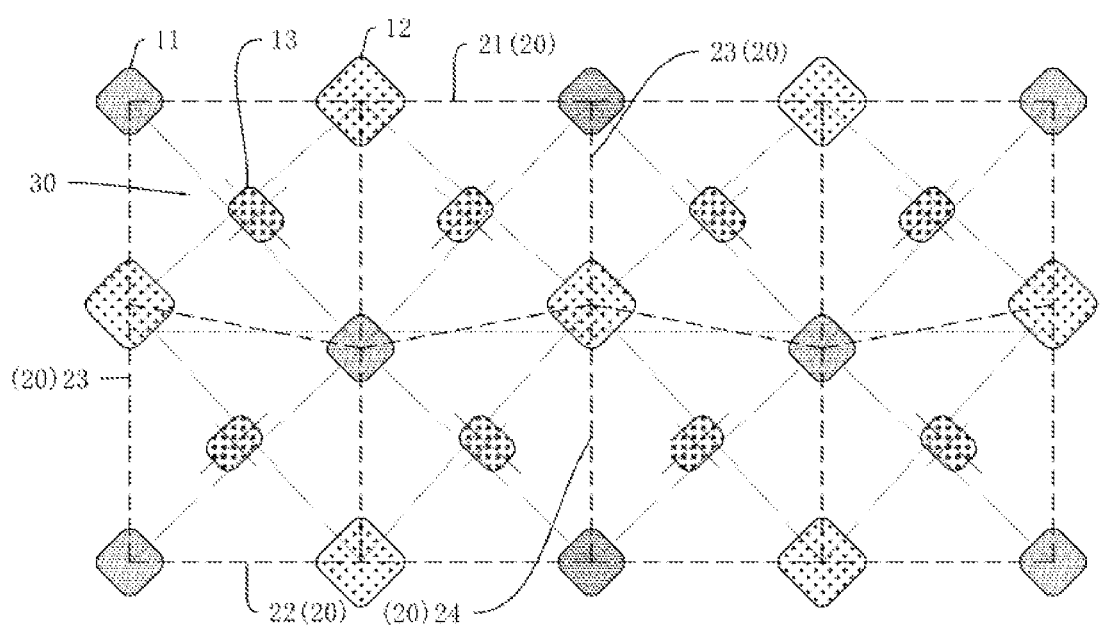
FIG. 2 is a schematic structural diagram of a pixel arrangement corresponding to two virtual rectangles of a display panel according to an embodiment of the present application.

In this embodiment, each repeating unit includes a virtual rectangle 20 as shown in FIG. 1. Please refer to FIG. 2, between two virtual rectangles 20 of two adjacent repeating units, the third side 23 of one of the virtual rectangles 20 coincides with the fourth side 24 of the other virtual rectangle 20, or the first side 21 of one of the virtual rectangles 20 is coincident with the second side 22 of the other virtual rectangle 20.

As described above, the display panel provided by the present application includes a virtual rectangle 20. The virtual rectangle 20 includes four virtual right-angled trapezoids 30. In each virtual right-angled trapezoid 30, the distances from the center of the third sub-pixel 13 to the centers of two first sub-pixels 11 are equal, and lines connecting the center of the third sub-pixel 13 to the centers of the two first sub-pixels 11 are not overlapped. That is, compared with arranging the center of the third sub-pixel 13 at the connecting line between the centers of the two first sub-pixels 11, in this embodiment of the present application, the third sub-pixel located within the virtual right-angled trapezoid 30 does not overlap with the intersection of the two diagonal lines in the virtual right-angled trapezoid 30. This can increase the distance between the third sub-pixel 13 and the first sub-pixel 11 and keep the distances between the third sub-pixel 13 and the two first sub-pixels 11 equal, respectively. Therefore, the probability of accidental light emission between the third sub-pixel 13 and the two first sub-pixels 11 is reduced, and the display effect is improved. In addition, in the embodiment of the present application, by increasing the distance between the adjacent first sub-pixel 11 and the second sub-pixel 12 in the virtual rectangle 20, the support column 40 can be arranged between the first sub-pixel 11 and the second sub-pixel 12 with a larger distance, and the arrangement area of the support column 40 can be increased. Furthermore, in the evaporation process, the supporting effect of the support column 40 on the mask can be improved, and the mask can be prevented from scratching the display panel.

Figure 3:
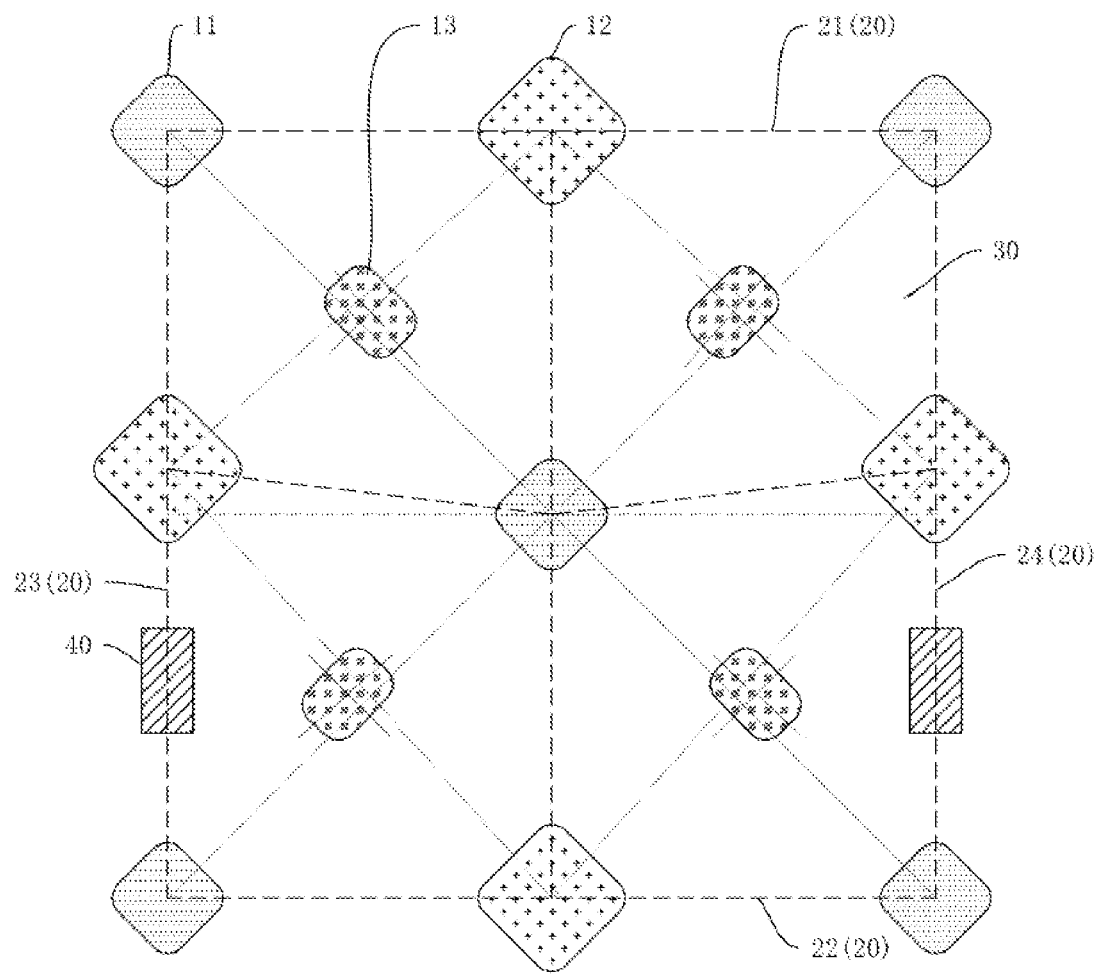
FIG. 3 is a schematic structural diagram of another pixel arrangement corresponding to a virtual rectangle of a display panel provided by an embodiment of the present application.

In another embodiment of the present application, please refer to FIG. 3, the difference between this embodiment and the previous embodiment is that the distance from the center of a first sub-pixel 11 within the virtual rectangle 20 to the first side 21 is equal to the distance from the center of the first sub-pixel 11 within the virtual rectangle 20 to the second side 22, and the distance from the center of the first sub-pixel 11 within the virtual rectangle 20 to the third side 23 is equal to the distance from the center of the first sub-pixel 11 within the virtual rectangle 20 to the fourth side 24.

Wherein, the distance from the center of a first sub-pixel 11 located within the virtual rectangle 20 to the second sub-pixel 12 located at the first side 21 is equal to the distance from the center of the second sub-pixel 12 at the first side 21 to the center of the adjacent first sub-pixel 11 at the corner of the virtual rectangle 20. The distance from the center of the second sub-pixel 12 at the first side 21 to the center of the adjacent first sub-pixel 11 at the corner of the virtual rectangle 20 is greater than the distance from the center of the second sub-pixel 12 at the third side 23 to the adjacent first sub-pixel 11 at the corner of the virtual rectangle 20 and is less than the distance from the center of the second sub-pixel 12 at the third side 23 to another adjacent first sub-pixel 11 located at the corner of the virtual rectangle 20.

Similarly, the distance from the center of a first sub-pixel 11 located within the virtual rectangle 20 to the second sub-pixel 12 located at the second side 22 is equal to the distance from the center of the second sub-pixel 12 at the second side 22 to the center of the adjacent first sub-pixel 11 at the corner of the virtual rectangle 20. The distance from the center of the second sub-pixel 12 at the second side 22 to the center of the adjacent first sub-pixel 11 at the corner of the virtual rectangle 20 is less than the distance from the center of the second sub-pixel 12 at the third side 23 to the adjacent first sub-pixel 11 at the corner of the virtual rectangle 20 and greater than the distance from the center of the second sub-pixel 12 at the third side 23 to another adjacent first sub-pixel 11 located at the corner of the virtual rectangle 20.

In addition, in this embodiment, the second sub-pixel 12 located at the third side 23 and the second sub-pixel 12 located at the fourth side 24 are both located on the same side of the mid-perpendicular line of the third side, and the distance from the second sub-pixel 12 located at the third side 23 to the midpoint of the third side 23 is equal to the distance from the second sub-pixel 12 located at the fourth side 24 to the midpoint of the fourth side 24.

As shown in FIG. 3, in this embodiment, the support columns 40 are arranged at the first section of the third side 23 and the third section of the fourth side 24, that is, in the embodiment of the present application, the support column 40 is arranged between the sub-pixels with a larger distance, which can increase the area of the support column 40. Furthermore, when the mask is used for the evaporation process, the supporting effect of the support column 40 on the mask can be improved. This prevents the mask from scratching the display panel and improves the yield of the display panel.

Figure 4:
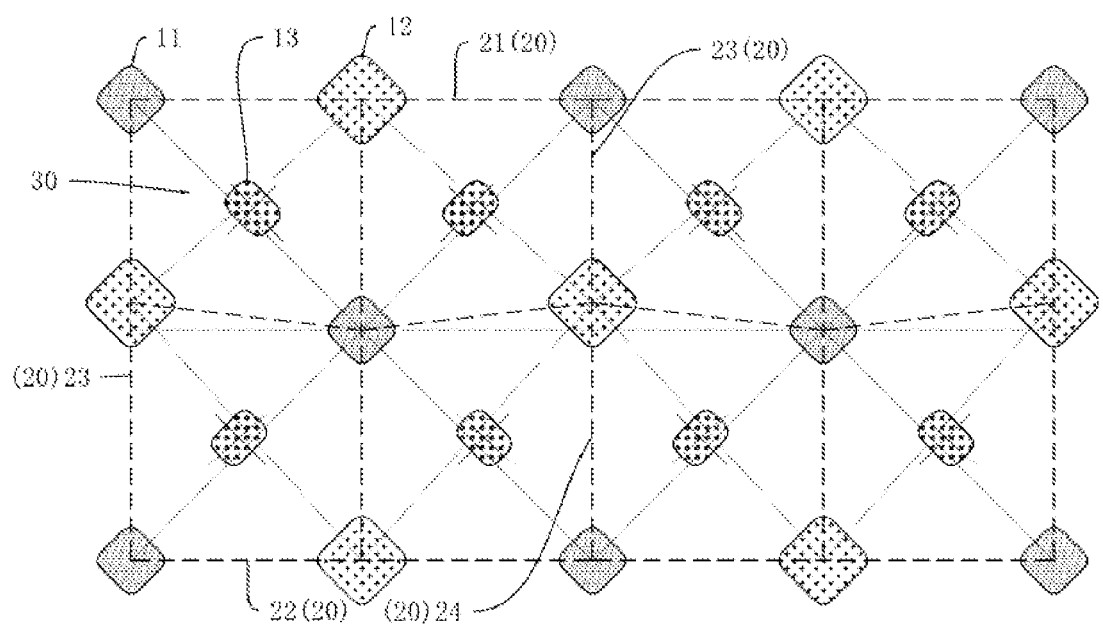
FIG. 4 is a schematic structural diagram of another pixel arrangement corresponding to two virtual rectangles of a display panel according to an embodiment of the present application.

Further, in this embodiment, each repeating unit includes a virtual rectangle 20 as shown in FIG. 3. Please refer to FIG. 4, between two adjacent virtual rectangles 20, the third side 23 of one virtual rectangle 20 coincides with the fourth side 24 of the other virtual rectangle 20, or the first side 21 of one of the virtual rectangles 20 is coincident with the second side 22 of the other virtual rectangle 20.

As described above, the display panel provided by the present application includes a virtual rectangle 20. The virtual rectangle 20 includes four virtual right-angled trapezoids 30. In each virtual right-angled trapezoid 30, the distances from the center of the third sub-pixel 13 to the centers of two first sub-pixels 11 are equal, and lines connecting the center of the third sub-pixel 13 to the centers of the two first sub-pixels 11 are not overlapped. That is, compared with arranging the center of the third sub-pixel 13 at the connecting line between the centers of the two first sub-pixels 11, in this embodiment of the present application, the third sub-pixel located within the virtual right-angled trapezoid 30 does not overlap with the intersection of the two diagonal lines in the virtual right-angled trapezoid 30. This can increase the distance between the third sub-pixel 13 and the first sub-pixel 11 and keep the distances between the third sub-pixel 13 and the two first sub-pixels 11 equal, respectively. Therefore, the probability of accidental light emission between the third sub-pixel 13 and the two first sub-pixels 11 is reduced, and the display effect is improved. In addition, in the embodiment of the present application, by increasing the distance between the adjacent first sub-pixel 11 and the second sub-pixel 12 in the virtual rectangle 20, the support column 40 can be arranged between the first sub-pixel 11 and the second sub-pixel 12 with a larger distance, and the arrangement area of the support column 40 can be increased. Furthermore, in the evaporation process, the supporting effect of the support column 40 on the mask can be improved, and the mask can be prevented from scratching the display panel.

Figure 5:
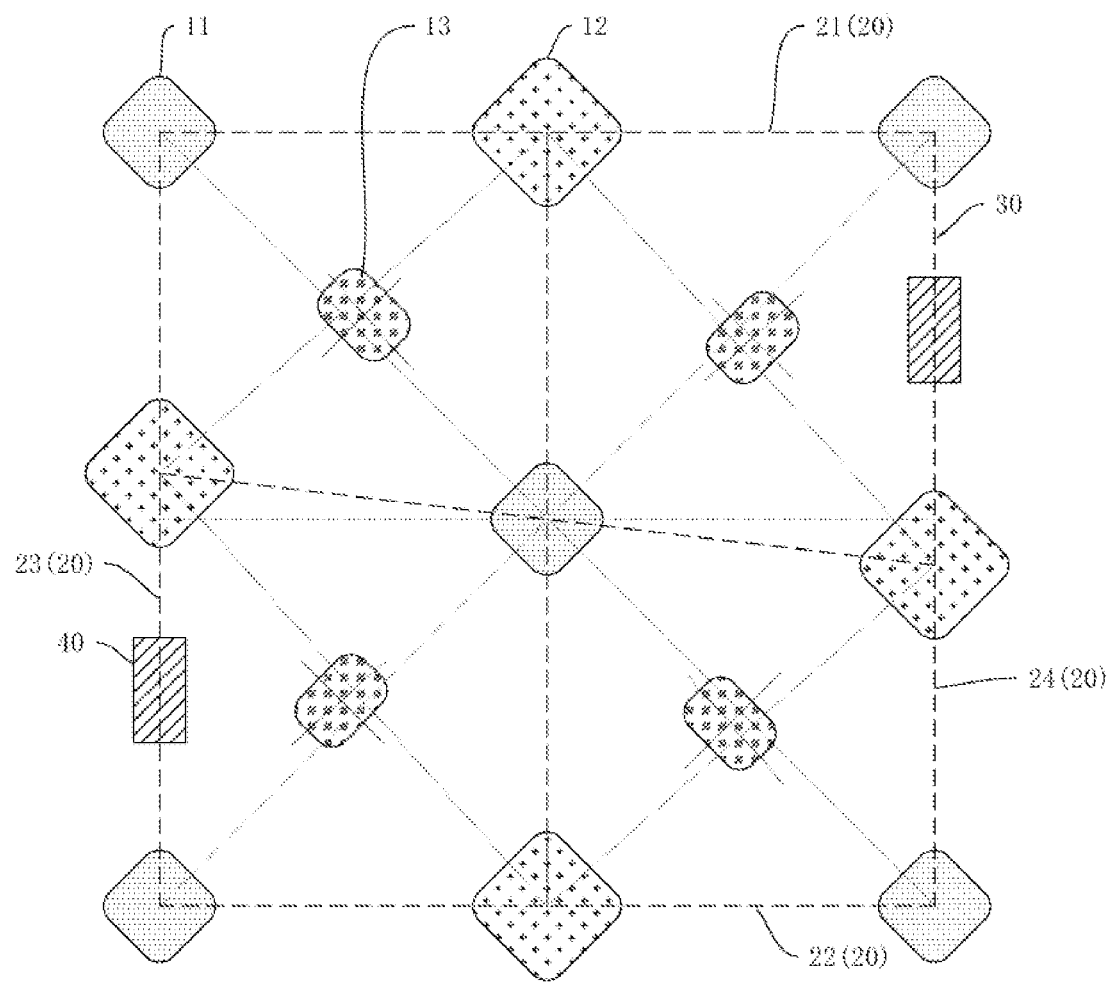
FIG. 5 is a schematic structural diagram of yet another pixel arrangement corresponding to a virtual rectangle of a display panel provided by an embodiment of the present application.

In another embodiment of the present application, please refer to FIG. 5, the difference between this embodiment and the previous embodiment is that the center of the second sub-pixel located at the third side 23 and the center of the second sub-pixel located at the fourth side are located on opposite sides of the mid-perpendicular line of the third side, respectively.

Wherein, the distance from the center of the second sub-pixel 12 located at the first side 21 to the center of a first sub-pixel 11 located within the virtual rectangle 20 is equal to the distance from the center of the second sub-pixel 12 located at the first side 21 to the center of the first sub-pixel 11 located at the corner of the virtual rectangle 20 and is greater or less than the distance from the center of the second sub-pixel 12 located at the third side 23 to the center of the first sub-pixel 11 located at the corner of the virtual rectangle 20. The distance from the center of the second sub-pixel 12 located at the first side 21 to the center of a first sub-pixel 11 located within the virtual rectangle 20 is equal to the distance from the center of the second sub-pixel 12 located at the first side 21 to the center of the first sub-pixel 11 located at the corner of the virtual rectangle 20 and is greater or less than the distance from the center of the second sub-pixel 12 located at the fourth side 24 to the center of the first sub-pixel 11 located at the corner of the virtual rectangle 20.

In this embodiment, as shown in FIG. 5, the third side 23 includes a first section and a second section located at both sides of the second sub-pixel 12, and the fourth side 24 includes a third section and a fourth section located at both sides of the second sub-pixel 12, wherein the length of the first section is greater than the length of the second section, and the length of the third section is greater than the length of the fourth section. Specifically, the first section is located at the lower side of the third side 23, the second section is located at the upper side of the third side 23, the third section is located at the upper side of the fourth side 24, and the fourth section is located at the lower side of the fourth side 24. Further, the support columns 40 are arranged at the first section of the third side 23 and the third section of the fourth side 24. In this embodiment of the present application, the support columns 40 are arranged between sub-pixels with a larger distance, so that the area of the support columns 40 can be increased. Furthermore, when the mask is used for the evaporation process, the supporting effect of the support column 40 on the mask can be improved. This can prevent the mask from scratching the display panel and improve the yield of the display panel.

Figure 6:
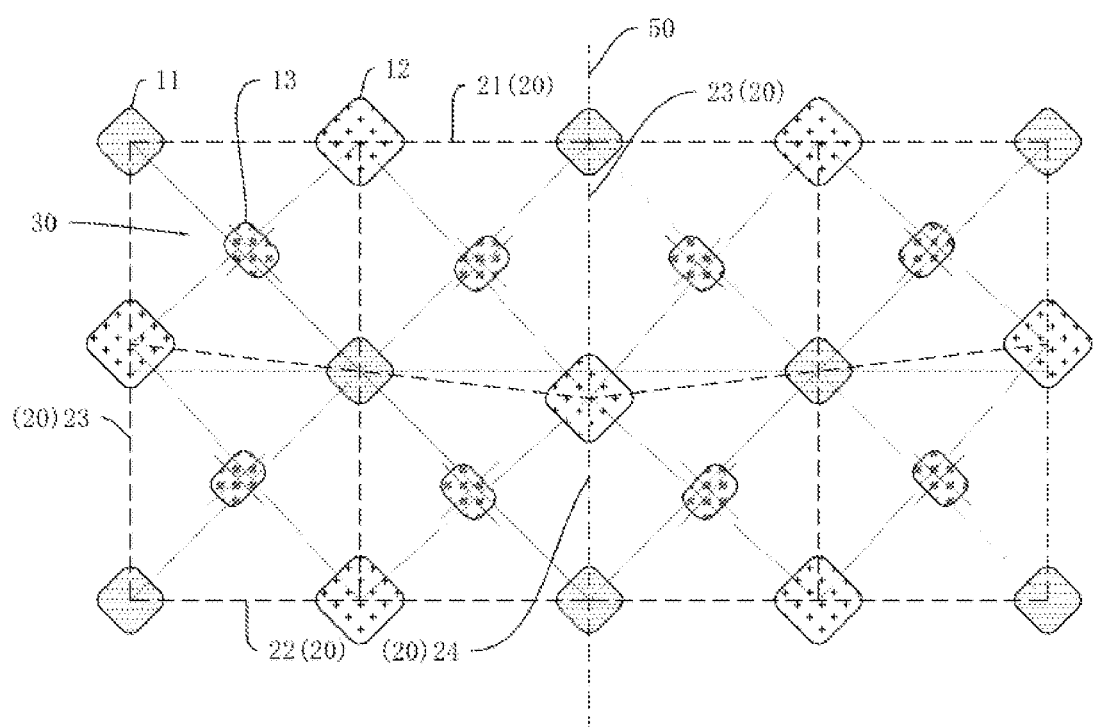
FIG. 6 is a schematic structural diagram of yet another pixel arrangement corresponding to two virtual rectangles of a display panel according to an embodiment of the present application.

Further, please refer to FIG. 5 and FIG. 6, in this embodiment, each repeating unit includes two virtual rectangles 20 as shown in FIG. 5. Between two adjacent virtual rectangles 20, as shown in FIG. 6, the third side 23 of one virtual rectangle 20 and the fourth side 24 of the other virtual rectangle 20 are both located at the virtual straight line 50, and one of the virtual rectangles 20 and the other virtual rectangle 20 are axially symmetrical with respect to the virtual straight line 50. That is, the third side 23 of one of the virtual rectangles 20 coincides with the fourth side 24 of the other virtual rectangle 20. In addition, between two adjacent repeating units, the third side 23 of one of the repeating units coincides with the fourth side 24 of the other repeating unit, or the first side 21 of one of the repeating units coincides with the second side 22 of the other repeating unit.

As described above, the display panel provided by the present application includes a virtual rectangle 20. The virtual rectangle 20 includes four virtual right-angled trapezoids 30. In each virtual right-angled trapezoid 30, the distances from the center of the third sub-pixel 13 to the centers of two first sub-pixels 11 are equal, and lines connecting the center of the third sub-pixel 13 to the centers of the two first sub-pixels 11 are not overlapped. That is, compared with arranging the center of the third sub-pixel 13 at the connecting line between the centers of the two first sub-pixels 11, in this embodiment, the third sub-pixel located within the virtual right-angled trapezoid 30 does not overlap with the intersection of the two diagonal lines in the virtual right-angled trapezoid 30. This can increase the distance between the third sub-pixel 13 and the first sub-pixel 11 and keep the distances between the third sub-pixel 13 and the two first sub-pixels 11 equal, respectively. Therefore, the probability of accidental light emission between the third sub-pixel 13 and the two first sub-pixels 11 is reduced, and the display effect is improved. In addition, in the embodiment of the present application, by increasing the distance between the adjacent first sub-pixel 11 and the second sub-pixel 12 in the virtual rectangle 20, the support column 40 can be arranged between the first sub-pixel 11 and the second sub-pixel 12 with a larger distance, and the arrangement area of the support column 40 can be increased. Furthermore, in the evaporation process, the supporting effect of the support column 40 on the mask can be improved, and the mask can be prevented from scratching the display panel.

In other embodiments of the present application, the display area of the display panel may also include a combination of any two or three kinds of repeating units formed by the virtual rectangles 20 in FIG. 1, FIG. 3, and FIG. 5. Between any two adjacent repeating units, the third side 23 of one repeating unit close to the other repeating unit coincides with the fourth side 24 of the other repeating unit, and the first side 21 of one of the repeating units adjacent to the other repeating unit coincides with the second side 22 of the other repeating unit.

In addition, an embodiment of the present application further provides a display device, the display device includes the display panel and the device main body described in the above embodiments, and the display panel and the device main body are combined into one piece.

Wherein, the device main body may include a frame body or a drive assembly, etc., which is not limited herein.

Continuing from the above, in the embodiment of the present application, in the virtual rectangle 20, the distance between the third sub-pixel 13 and the first sub-pixel 11, and the distance between the third sub-pixel 13 and the second sub-pixel 12 in the same virtual right-angled trapezoid 30 are increased. This reduces the probability of accidental light emission between the third sub-pixel 13 and the first sub-pixel 11 and the second sub-pixel 12 and improves the display effect of the display panel.

In the above-mentioned embodiments, the description of each embodiment has its own emphasis. For parts that are not described in detail in a certain embodiment, reference may be made to the relevant descriptions of other embodiments.

The display panel and the display device provided by the embodiments of the present application have been introduced in detail above. The principles and implementations of the present application are described herein using specific examples, and the descriptions of the embodiments are only used to help understand the technical solutions and core ideas of the present application. One ordinary skill in the art should understand that she (or he) still can make modifications to the technical solutions described in the foregoing embodiments or perform equivalent replacements to some of the technical features. However, these modifications or replacements do not make the essence of the technical solutions deviate from the scope of the technical solutions of the embodiments of the present application.

What is claimed is:

1. A display panel, comprising first sub-pixels, second sub-pixels, and third sub-pixels, wherein the first sub-pixels are arranged at four corners of a virtual rectangle and within the virtual rectangle, and the second sub-pixels are arranged at four sides of the virtual rectangle;
   wherein in the virtual rectangle, one of the first sub-pixels at one of the corners, two second sub-pixels adjacent to the first sub-pixel, and one of the first sub-pixels within the virtual rectangle form a virtual right-angled trapezoid; and
   wherein one of the third sub-pixels is arranged within the virtual right-angled trapezoid, distances from a center of the third sub-pixel to centers of two first sub-pixels corresponding to the virtual right-angled trapezoid are equal, and the center of the third sub-pixel does not overlap with a line connecting the centers of the two first sub-pixels;
   wherein the virtual rectangle comprises a first side and a second side arranged oppositely and a third side and a fourth side arranged oppositely, and wherein a line connecting centers of two second sub-pixels located at the first side and the second side is parallel to the third side, and the center of the first sub-pixel located within the virtual rectangle overlaps the line connecting the centers of the two second sub-pixels located at the first side and the second side;
   wherein a distance from the center of the second sub-pixel located at the third side to a midpoint of the third side is equal to a distance from the center of the second sub-pixel located at the fourth side to a midpoint of the fourth side.

2. The display panel of claim 1, wherein distances from the center of the third sub-pixel to centers of the two second sub-pixels corresponding to the virtual right-angled trapezoid are equal, and the center of the third sub-pixel does not overlap with a line connecting the centers of the two second sub-pixels.

3. The display panel of claim 1, wherein on at least one side of the virtual rectangle, a first distance from a center of one of the second sub-pixels to a center of an adjacent one of the first sub-pixels is less than a second distance from the center of the second sub-pixel to a center of another adjacent one of the first sub-pixels.

4. The display panel of claim 3, further comprising a first support column arranged at a side of the virtual rectangle and located between a pair of one said second sub-pixel and one said first sub-pixel which are arranged adjacent to each other, wherein a distance from a center of the first sub-pixel adjacent to the first support column to a center of the second sub-pixel adjacent to the first support column is defined as the second distance.

5. The display panel of claim 1, wherein a distance from the center of the first sub-pixel located within the virtual rectangle to the center of the second sub-pixel located at the first side is greater than or equal to a distance from the center of the second sub-pixel located at the first side to a center of an adjacent first sub-pixel located at a corner of the virtual rectangle.

6. The display panel of claim 5, further comprising a second support column, wherein the second support column overlaps with a line connecting the center of the first sub-pixel located within the virtual rectangle and the center of the second sub-pixel located at the first side.

7. The display panel of claim 1, wherein the center of the second sub-pixel located at the first side overlaps with a midpoint of the first side, and the center of the second sub-pixel located at the second side overlaps with a midpoint of the second side; and
wherein a center of a second sub-pixel located at the third side does not overlap with the midpoint of the third side, and a center of a second sub-pixel located at the fourth side does not overlap with the midpoint of the fourth side.

8. The display panel of claim 7, wherein the center of the second sub-pixel located at the third side and the center of the second sub-pixel located at the fourth side are both arranged at a first side of a mid-perpendicular line of the third side.

9. The display panel of claim 8, wherein the center of the first sub-pixel located within the virtual rectangle is arranged at a second side of the mid-perpendicular line of the third side, and the first side and the second side are located at opposite sides of the mid-perpendicular line of the third side, respectively.

10. The display panel of claim 9, wherein a distance from the center of the first sub-pixel located within the virtual rectangle to a center of the virtual rectangle is less than or equal to a distance from the center of the second sub-pixel located at the third side to the midpoint of the third side, and/or
the distance from the center of the first sub-pixel located within the virtual rectangle to the center of the virtual rectangle is less than or equal to a distance from the center of the second sub-pixel located at the fourth side to the midpoint of the fourth side.

11. The display panel of claim 7, wherein a distance from the center of the second sub-pixel located at the first side to the center of the first sub-pixel located within the virtual rectangle is greater than a distance from the center of the second sub-pixel located at the third side to the center of the first sub-pixel located at the first side closest to the second sub-pixel; and a distance from the center of the second sub-pixel located at the first side to the center of the first sub-pixel located at one of the corners of the virtual rectangle is greater than a distance from the center of the second sub-pixel located at the third side to the center of the first sub-pixel located at the first side.

12. The display panel of claim 1, wherein lines connecting the center of the first sub-pixel located within the virtual rectangle to centers of the second sub-pixels located at the four sides of the virtual rectangle divide the virtual rectangle into four virtual right-angled trapezoids.

13. The display panel of claim 12, wherein each virtual right-angled trapezoid comprises a first angle, a second angle, a third angle, and a fourth angle, the first angle and the second angle are both right angles, and an absolute value of a difference between the third angle and the fourth angle is greater than 0° and less than or equal to 20°.

14. A display panel, comprising first sub-pixels, second sub-pixels, and third sub-pixels, wherein the first sub-pixels are arranged at four corners of a virtual rectangle and within the virtual rectangle, and the second sub-pixels are arranged at four sides of the virtual rectangle;
wherein in the virtual rectangle, one of the first sub-pixels at one of the corners, two second sub-pixels adjacent to the first sub-pixel, and one of the first sub-pixels within the virtual rectangle form a virtual right-angled trapezoid; and
wherein one of the third sub-pixels is arranged within the virtual right-angled trapezoid, distances from a center of the third sub-pixel to centers of two first sub-pixels corresponding to the virtual right-angled trapezoid are equal, and the center of the third sub-pixel does not overlap with a line connecting the centers of the two first sub-pixels;
wherein the virtual rectangle comprises a first side and a second side arranged oppositely and a third side and a fourth side arranged oppositely, and wherein a line connecting centers of two second sub-pixels located at the first side and the second side is parallel to the third side, and the center of the first sub-pixel located within the virtual rectangle overlaps the line connecting the centers of the two second sub-pixels located at the first side and the second side;
wherein a distance from the center of the first sub-pixel located within the virtual rectangle to the first side is equal to a distance from the center of the first sub-pixel located within the virtual rectangle to the second side.

15. A display panel, comprising first sub-pixels, second sub-pixels, and third sub-pixels, wherein the first sub-pixels are arranged at four corners of a virtual rectangle and within the virtual rectangle, and the second sub-pixels are arranged at four sides of the virtual rectangle;
wherein in the virtual rectangle, one of the first sub-pixels at one of the corners, two second sub-pixels adjacent to the first sub-pixel, and one of the first sub-pixels within the virtual rectangle form a virtual right-angled trapezoid; and
wherein one of the third sub-pixels is arranged within the virtual right-angled trapezoid, distances from a center of the third sub-pixel to centers of two first sub-pixels corresponding to the virtual right-angled trapezoid are equal, and the center of the third sub-pixel does not overlap with a line connecting the centers of the two first sub-pixels;
wherein the virtual rectangle comprises a first side and a second side arranged oppositely and a third side and a fourth side arranged oppositely, and wherein a line connecting centers of two second sub-pixels located at the first side and the second side is parallel to the third side, and the center of the first sub-pixel located within the virtual rectangle overlaps the line connecting the centers of the two second sub-pixels located at the first side and the second side;

wherein the center of the second sub-pixel located at the third side and the center of the second sub-pixel located at the fourth side are located at opposite sides of a mid-perpendicular line of the third side, respectively.

16. The display panel of claim 15, wherein a distance from the center of the first sub-pixel located within the virtual rectangle to the first side is equal to a distance from the center of the first sub-pixel located within the virtual rectangle to the second side, and a distance from the center of the second sub-pixel located at the third side to a midpoint of the third side is equal to a distance from the center of the second sub-pixel located at the fourth side to a midpoint of the fourth side.

17. The display panel of claim 15, further comprising repeating units, and each repeating unit comprising two virtual rectangles, wherein in one of the repeating units, a third side of one of the virtual rectangles and a fourth side of another one of the virtual rectangles are both located at a virtual straight line, and one of the virtual rectangles and another one of the virtual rectangles are axially symmetrical with respect to the virtual straight line.

\* \* \* \* \*